(12) United States Patent
Ranganathan et al.

(10) Patent No.: US 7,256,608 B2
(45) Date of Patent: Aug. 14, 2007

(54) METHOD AND APPARATUS FOR REDUCING LEAKAGE IN INTEGRATED CIRCUITS

(75) Inventors: Nagarajan Ranganathan, Tampa, FL (US); Narender Hanchate, Sunnyvale, CA (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 11/422,973

(22) Filed: Jun. 8, 2006

(65) Prior Publication Data

US 2007/0007996 A1    Jan. 11, 2007

Related U.S. Application Data

(63) Continuation of application No. PCT/US04/40989, filed on Dec. 8, 2004.

(60) Provisional application No. 60/481,751, filed on Dec. 8, 2003.

(51) Int. Cl.
*H03K 17/16*    (2006.01)

(52) U.S. Cl. ............................ 326/26; 326/83; 326/112

(58) Field of Classification Search ............ 326/37–41, 326/22–27, 112, 119, 121
See application file for complete search history.

(56) References Cited

U.S. PATENT DOCUMENTS

| 6,107,829 | A  | * | 8/2000 | Martin ......................... 326/58 |
| 6,169,419 | B1 | * | 1/2001 | De et al. ....................... 326/58 |
| 6,925,025 | B2 |   | 8/2005 | Deng et al. |
| 7,098,689 | B1 | * | 8/2006 | Tuan et al. .................... 326/44 |

OTHER PUBLICATIONS

Veendrick ,"Short Dissipation of Static CMOS Circuitry and its Impact on the Design of Buffer Circuits", IEEE JSSC, Aug. 1984, pp. 468-473, vol. SC-19.

Chandrakasan et al., "Minimizing Power Consumption in Digital CMOS Circuits", Proc of the IEEE, Apr. 1995, pp. 498-523, vol. 83.

Gu et al.,"Power Dissipation Analysis and Optimization for Deep Submicron CMOS Digital Circuits", IEEE JSSC, May 1996, pp. 707-713, vol. 31, No. 5.

Wang et al., "Static Power Optimization of Deep Submicron CMOS Circuits for Dual VT Technology", Procc. of ICCAD, Apr. 1998, pp. 490-496.

Sheu et al., "BSIM: Berkeley Short- Channel IGFET Model for MOS Transistors", IEEE JSSC, Aug. 1987, pp. 558-566, vol. 22, No. 4.

(Continued)

*Primary Examiner*—Don Le
(74) *Attorney, Agent, or Firm*—Molly L. Sauter; Smith & Hopen, P.A.

(57) ABSTRACT

An efficient design methodology in accordance with the present invention is described for reducing the leakage power in CMOS circuits. The method and apparatus in accordance with the present invention yields better leakage reduction as the threshold voltage decreases and hence aids in further reduction of supply voltage and minimization of transistor sizes. Unlike other leakage control techniques, the technique of the present invention does not need any control circuitry to monitor the states of the circuit. Hence, avoiding the sacrifice of obtained leakage power reduction in the form of dynamic power consumed by the additional circuitry to control the overall circuit states.

25 Claims, 17 Drawing Sheets

(a)

(b)

OTHER PUBLICATIONS

Thompson et al., "MOS Scaling: Transistor Challenges for the 21st Century", Intel Technology Journal, 1998,vol. Q3, no month.

Halter et al. "A Gate-level Leakage Power Reduction Method for Ultra-Low-Power CMOS Circuits" in Proc. of the IEEE Custom Integrated Circuits Conf, 1997, pp. 475-478, no month.

Duarte et al. "Evaluating Run-Time Techniques for Leakage Power Reduction", 7th proc. of ASP-DAC, 2002, pp. 31-38, no month.

Powell et al."Gated- VDD: A Circuit Technique to Reduce Leakage in Deep Submicron Cache Memories", Proc of ISLPED, 2000, pp. 90-95, no month.

Johnson et al. "Leakage Control with Efficient Use of Transistor Stacks in Single Threshold CMOS", IEEE Trans. on VLSI Systems, Feb. 2002, pp. 1-5, vol. 10 No. 1.

Kao et al. "Transistor Sizing Issues and Tool for Multi- Threshold CMOS Technology" 34th Proc. of DA, 1997, pp. 409-414, no month.

Wei et al., "Design and Optimization of Low Voltage High Performance Dual Threshold CMOS Circuits", 35th Proc. of DAC, 1998, pp. 489-492, no month.

Sundararajan et al., "Low Power Synthesis of Dual Threshold Voltage CMOS VLSI Circuits" in Proc. of ISLPED, 1999, pp. 139-144, no month.

Rele et al., "Optimizing Static Power Dissipation by Functional Units in Superscalar Processors" in Proc. of Intl. Conf. on Complier Construction, Apr. 2002, pp. 261-275.

Narendra et al. , "Scaling of Stack Effect and its Application for Leakage Reduction", Proc.of ISLPED, Aug. 2001, pp. 195-200.

Sirichotiyakul et al. , "Duet: An Accurate Leakage Estimation and Optimization Tool for Dual-Vt Circuits", IEEE Trans. on VLSI Systems, Apr. 2002, pp. 79-90, vol. 10 No. 2.

Sentovich et al., SIS: A System for Sequential Circuit Synthesis, University of California, Berkeley, 1992, no month.

Reis , "Covering Strageties for Library Free Technology Mapping" Proc. of the XII Brazilian Symposium on Integrated Circuits and Systems Design, 1998, no month.

* cited by examiner

Fig. 2

(1) $$V_t = V_{FB} + \phi_s + k_1\sqrt{\phi_s} - k_2\phi_s - \eta V_{dd}$$

(2) $$I_s = I_0 \exp((V_{gs} - V_t)/nV_T)(1 - \exp(-V_{ds}/V_T))$$

(3) $$I_0 = \mu_0 C_{ox}(W_{eff}/L_{eff})V_t^2 e^{1.8}$$

(4) $$I_{s1} : I_{s2} : I_{s3} = 1.8\exp(\eta V_{dd}/nV_t) : 1.8 : 1$$

(5) $$S(t) = \lim_{D \to 0} \frac{Y_1(t) - Y(t)}{X_1(t) - X(t)} = \lim_{D \to 0} \frac{Y_1(t) - Y(t)}{D}$$

Fig. 4
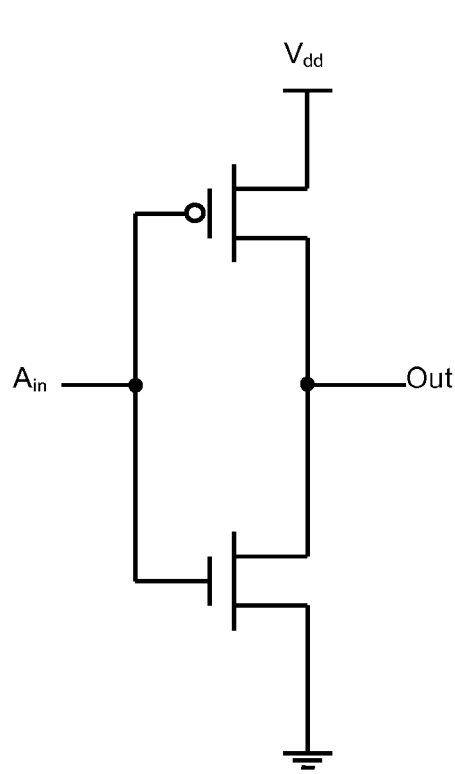
(a)
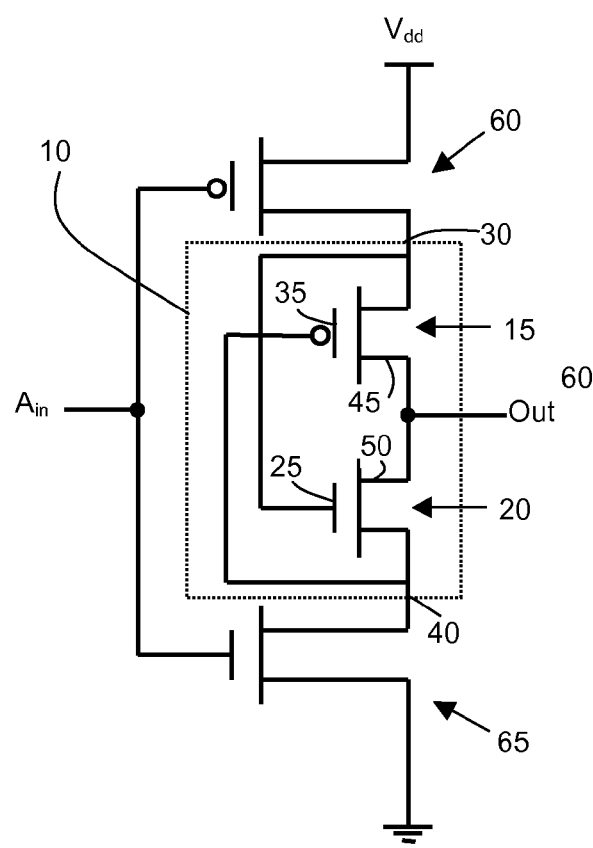
(b)

Fig. 6
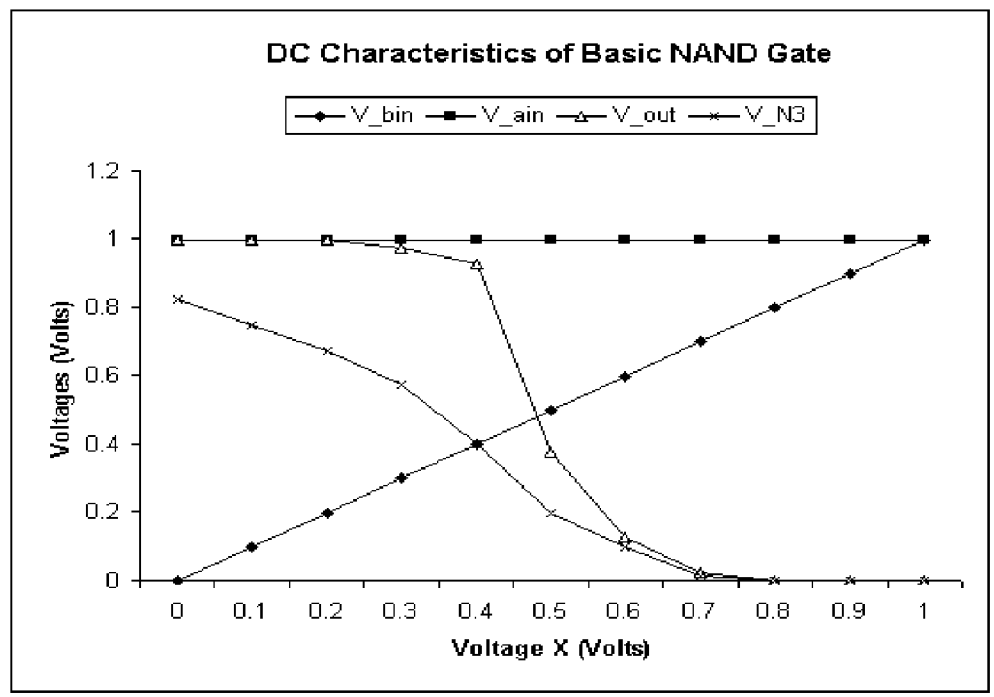
(a)
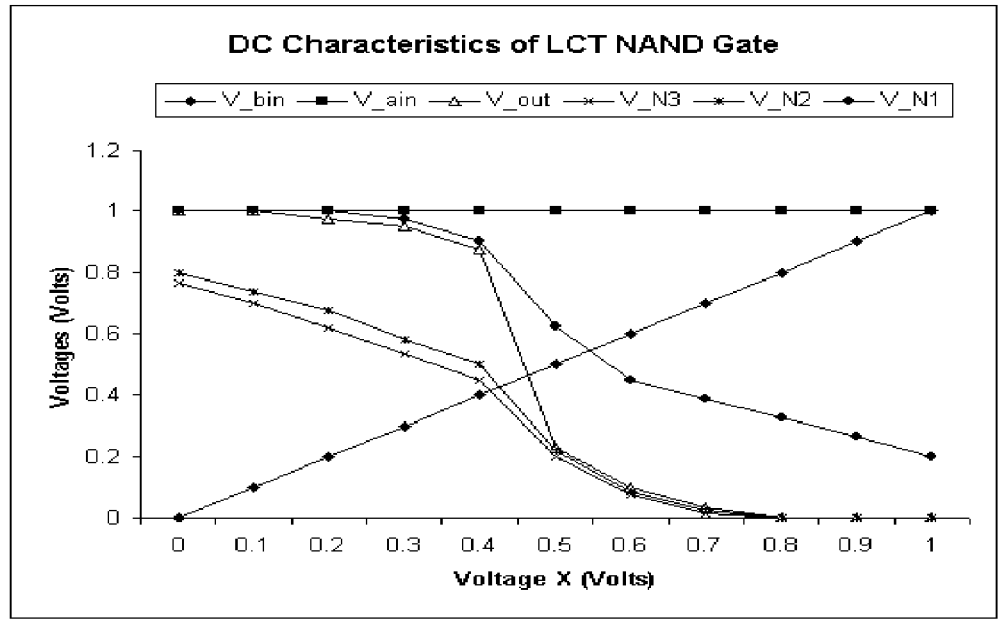
(b)

Fig. 7

STATE MATRIX OF 2-INPUT LCT NAND GATE

| Transistor Reference | Input Vector - $(A_{in}, B_{in})$ | | | |
|---|---|---|---|---|
| | (0,0) | (0,1) | (1,0) | (1,1) |
| $M_1$ | On state | On state | Off state | Off state |
| $M_2$ | On state | Off state | On state | Off state |
| $LCT_1$ | Near Cut-Off state | Near Cut-Off state | Near Cut-Off state | On state |
| $LCT_2$ | On state | On state | On state | Near Cut-Off state |
| $M_3$ | Off state | Off state | On state | On state |
| $M_4$ | Off state | On state | Off state | On state |

Fig. 9

THRESHOLD VOLTAGES OF MOS MODELS USED

| Technology Process | Threshold Voltage of NMOS ($V_{tn}$) | Threshold Voltage of PMOS ($V_{tp}$) |
|---|---|---|
| 70nm | 0.2V | -0.22V |
| 100nm | 0.2607V | -0.303V |
| 130nm | 0.332V | -0.3499V |
| 180nm | 0.3999V | -0.42V |

Fig. 10

LEAKAGE POWER FOR 2-INPUT NAND GATE

| 100nm Process Technology, Supply Voltage = 1V | | | | | | |
|---|---|---|---|---|---|---|
| NAND gate type | Leakage Power Dissipation in Watts for Input Vector | | | | Delay in (ps) | % Average Savings |
| | (0,0) | (0,1) | (1,0) | (1,1) | | |
| Conventional | 1.228e-10 | 9.117e-10 | 5.356e-10 | 2.241e-09 | 13.53 | - |
| LCT | 1.180e-10 | 5.542e-10 | 4.477e-10 | 1.539e-09 | 18.79 | 30.20% |
| 1.5-LCT | 1.182e-10 | 5.788e-10 | 4.533e-10 | 1.593e-09 | 17.12 | 28.01% |
| 2-LCT | 1.194e-10 | 5.985e-10 | 4.606e-10 | 1.621e-09 | 15.64 | 26.54% |
| 2.5-LCT | 1.197e-10 | 6.114e-10 | 4.678e-10 | 1.651e-09 | 15.39 | 25.22% |
| Iso-LCT | 1.224e-10 | 6.394e-10 | 4.872e-10 | 1.704e-09 | 13.59 | 22.51% |
| 70nm Process Technology, Supply Voltage = 1V | | | | | | |
| Conventional | 6.450e-10 | 5.600e-09 | 3.817e-09 | 1.091e-08 | 15.16 | - |
| LCT | 6.065e-10 | 3.808e-09 | 3.622e-09 | 5.564e-09 | 21.40 | 35.12% |
| 1.5-LCT | 6.108e-10 | 3.900e-09 | 3.650e-09 | 5.742e-09 | 19.09 | 33.70% |
| 2-LCT | 6.146e-10 | 3.961e-09 | 3.667e-09 | 5.872e-09 | 18.36 | 32.71% |
| 2.5-LCT | 6.189e-10 | 4.016e-09 | 3.675e-09 | 6.060e-09 | 17.99 | 31.48% |
| Iso-LCT | 6.314e-10 | 4.125e-09 | 3.689e-09 | 6.196e-09 | 15.23 | 30.18% |

Note: Y-LCT = LCT transistors are Y times the widths of their respective type.

Fig. 11

NOISE ANALYSIS OF VARIOUS GATES

| CMOS Gate | Conventional Gate | | LCT Gate | |
|---|---|---|---|---|
| | Max Noise | Sensitivity | Max Noise | Sensitivity |
| Inverter | 0.3651 | -0.2744 | 0.4008 | -0.1517 |
| NAND2 | 0.2786 | -0.1986 | 0.3427 | -0.2025 |
| NOR2 | 0.4129 | -0.2241 | 0.4830 | -0.2543 |
| AOI22 | 0.3560 | -0.2840 | 0.3829 | -0.3642 |
| OAI22 | 0.3658 | -0.2864 | 0.4122 | -0.2938 |

Fig. 12
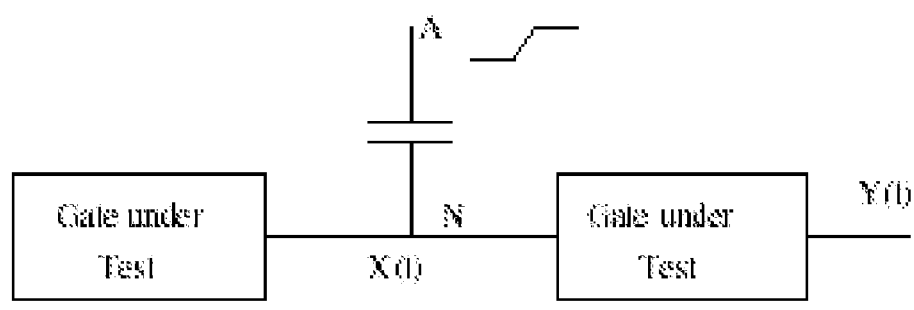
(a)
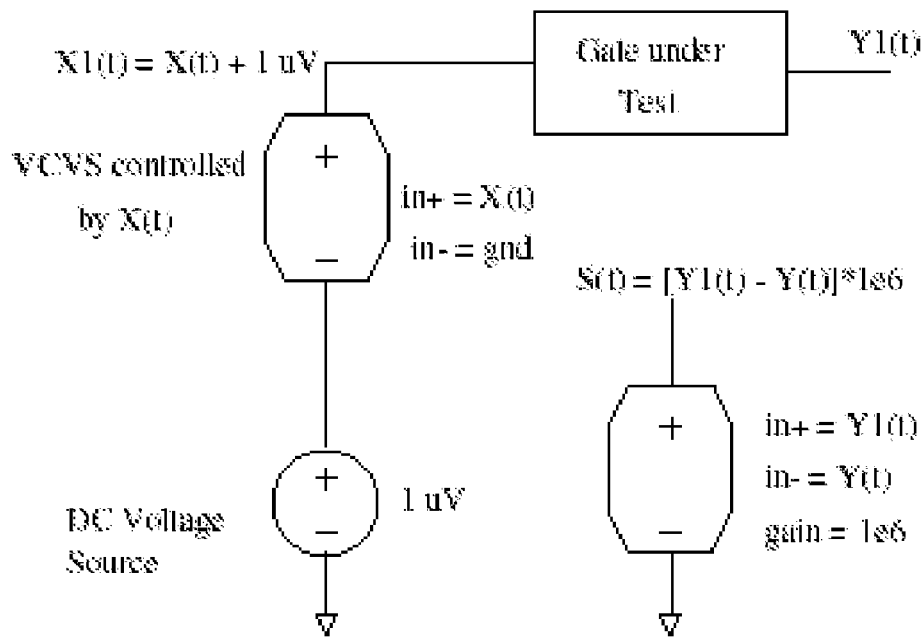
(b) (c)

Fig. 13

AREA OVERHEAD FOR A LCT GATE

| CMOS Gate Type | Number of Transistors in | |
|---|---|---|
| | UnModified Gate | LCT Gate |
| 2-input NAND | 4 | 6 |
| 2-input NOR | 4 | 6 |
| 2-input AND | 6 | 10 |
| 2-input OR | 6 | 10 |
| 3-input NAND | 6 | 8 |
| 3-input NOR | 6 | 8 |
| 3-input AND | 8 | 12 |
| 3-input OR | 8 | 12 |

Fig. 14
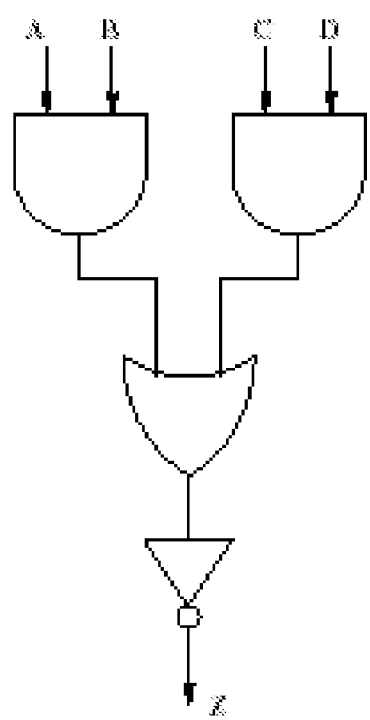
$Z = \overline{((A.B) + (C.D))}$
(a)
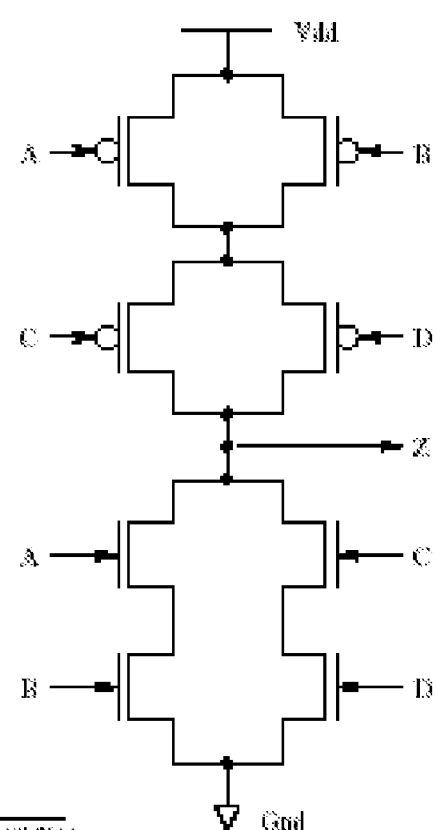
(b)

Fig. 17

TABLE VI
EXPERIMENTAL RESULTS FOR MCNC '91 BENCHMARKS

| MCNC '91 Circuit | Leak Pwr ($\mu W$) in $\mu W$ | | Dyn. Pwr (in $\mu W$) in $\mu W$) | | Total Pwr ($\mu W$) in $\mu W$ | | Norma-lized area | % Leakage savings by | |
|---|---|---|---|---|---|---|---|---|---|
| | U-MC | LCT-MC | U-MC | LCT-MC | U-MC | LCT-MC | | Stacks [10] with 16% delay overhead | LECTOR with no delay overhead |
| I1 | 1.159 | 0.156 | 1.122 | 1.094 | 1.275 | 0.291 | 1.21 | 67.34% | 86.54% |
| I2 | 2.305 | 0.735 | 2.420 | 2.661 | 2.375 | 0.867 | 1.14 | 61.64% | 68.11% |
| I3 | 1.383 | 0.419 | 1.063 | 1.025 | 1.451 | 0.712 | 1.18 | 61.97% | 69.70% |
| I4 | 2.356 | 0.632 | 2.043 | 1.995 | 2.436 | 0.756 | 1.12 | 55.03% | 73.17% |
| I5 | 4.625 | 0.475 | 5.905 | 5.945 | 5.473 | 0.732 | 1.19 | 83.51% | 89.72% |
| I6 | 6.906 | 1.912 | 18.62 | 18.85 | 12.70 | 6.495 | 1.13 | 60.74% | 72.31% |
| I7 | 8.033 | 3.126 | 25.62 | 25.59 | 17.95 | 9.248 | 1.12 | 51.36% | 65.01% |
| I8 | 39.05 | 5.038 | 59.06 | 58.34 | 41.08 | 10.56 | 1.08 | 74.32% | 83.23% |
| I9 | 21.90 | 2.897 | 38.79 | 37.24 | 25.75 | 8.982 | 1.12 | 85.15% | 86.77% |
| I10 | 40.47 | 5.842 | 54.58 | 52.43 | 43.31 | 11.23 | 1.15 | 83.39% | 85.56% |
| | | | | | | | | Dual $V_T$ [13] up to 64% delay overhead | LECTOR with no delay overhead |
| C432 | 1.395 | 0.672 | 6.970 | 6.889 | 1.923 | 1.260 | 1.17 | 28.83% | 51.82% |
| C499 | 3.469 | 1.444 | 16.38 | 16.03 | 5.037 | 2.999 | 1.15 | 22.96% | 58.37% |
| C880 | 6.141 | 1.154 | 9.472 | 9.502 | 7.972 | 2.493 | 1.18 | 82.67% | 81.21% |
| C1355 | 8.089 | 1.672 | 16.08 | 15.93 | 9.754 | 3.104 | 1.11 | 21.50% | 79.32% |
| C1908 | 19.61 | 1.926 | 28.43 | 27.10 | 24.53 | 3.813 | 1.13 | 84.92% | 90.18% |
| C2670 | 52.17 | 2.845 | 70.45 | 69.59 | 65.70 | 4.338 | 1.19 | 90.25% | 94.54% |
| C3540 | 64.79 | 3.852 | 81.65 | 76.49 | 73.41 | 4.588 | 1.14 | 83.36% | 94.05% |
| C5315 | 82.58 | 4.826 | 99.21 | 97.60 | 88.50 | 5.892 | 1.12 | 91.56% | 94.16% |
| C6288 | 163.7 | 9.725 | 520.4 | 502.2 | 390.2 | 30.23 | 1.10 | 61.75% | 94.05% |
| C7552 | 323.2 | 10.24 | 576.2 | 566.6 | 393.3 | 22.96 | 1.08 | 90.90% | 96.86% |

METHOD AND APPARATUS FOR REDUCING LEAKAGE IN INTEGRATED CIRCUITS

BACKGROUND OF INVENTION

One of the most popular Metal-Oxide-Semiconductor Field Effect Transistor (MOSFET) technologies available today is the complementary MOS (metal oxide semiconductor), or CMOS, technology. This technology makes use of both P and N channel devices in the same substrate material. Such devices are extremely useful, since the same signal that turns on a transistor of one type is used to turn off a transistor of the other type. A MOSFET transistor consists of three regions, referred to as the "source", the "gate" and the "drain". In an N-type transistor, the source and drain regions are doped with N type material and the substrate doped with P type material. In a P-type transistor, the source and drain regions are doped with P type material, and the substrate is doped with N type material. The source and drain regions are quite similar, and are labeled depending on to what they are connected. The source is the terminal, or node, which acts as the source of charge carriers; charge carriers leave the source and travel to the drain. In the case of an N channel, of N-type, MOSFET, the source is the more negative of the terminals; in the case of a P channel device, it is the more positive of the terminals. CMOS logic uses a combination of p-type and n-type metal-oxide-semiconductor field effect transistors (MOSFETs) to implement logic gates and other digital circuits found in computers, telecommunications and signal processing equipment.

Power dissipation is an important consideration in the design of CMOS VLSI circuits. High power consumption leads to reduction in the battery life in the case of battery-powered applications and affects reliability, packaging and cooling costs. The main sources of power dissipation are: (i) capacitive power dissipation due to the charging and discharging of the load capacitance (ii) short circuit currents due to the existence of a conducting path between the voltage supply and ground for the brief period during which a logic gate makes a transition and (iii) leakage current.

Leakage current in CMOS circuits is defined as the drain current when the gate-source voltage is zero. Leakage current consists of two main sources, reverse bias diode currents, which are due to stored charge between the drain and bulk of active transistors and sub-threshold currents, which are due to carrier diffusion between the source and drain of the off transistors. Of these two sources of leakage current, the sub-threshold current is the major component of leakage current and therefore of greatest concern.

There are techniques known in the art to reduce the power dissipation in CMOS circuits. It is known in the art that the short circuit power dissipation can be reduced to 10% of total power dissipation by designing the circuit to have equal input and output rise/fall edge times. The power dissipation resulting from switching activity is the dominant component for technology processes having feature size larger than 1 µm. With technology processes maturing towards deep submicron regime, the feature size of the transistors are being reduced, thereby reducing the load capacitances. The reduction in feature size also forces a reduction in the supply voltage because the reduced feature size cannot withstand the high supply voltages, thereby forcing supply voltage scaling. The quadratic dependence of switching power on supply voltage is taken benefit of by voltage scaling techniques for dynamic power savings. However, this technique also drastically increases the delay as the supply voltage approaches the threshold voltage ($V_t$) of the devices. In order to facilitate voltage scaling without affecting the performance, the threshold voltage must also be reduced. In general, the ratio between the supply voltage and the threshold voltage should be at least five so that the performance of the CMOS circuits is not affected. This ratio also leads to better noise margins and helps to avoid the hot-carrier effects in short channel devices.

Scaling down of the threshold voltage ($V_t$) results in an exponential increase of the sub-threshold leakage current. It can be seen from FIG. 1 that the leakage power is only 0.01% of the active power for 1 µm technology, while it is 10% of the active power for 0.1 µm technology. As such, there is a five-fold increase in leakage power as the technology process advances to a new generation of deep submicron and nanometer circuits. Projecting these trends, it can be seen that the leakage power dissipation will equal active power dissipation within a few generations. Hence, efficient leakage power reduction methods are very critical for the deep submicron and nanometer circuits.

Numerous methods for leakage power control have been reported in the literature. Known work in the art makes use of the dependence of the leakage current on the input vector to the gate of the transistor. With additional control logic, the circuit is put into a low-leakage standby state when it is idle and restored to the original state when reactivated. The use of a reactivation state forces the need to remember the original state information before going to low-leakage standby state. This requires special latches, thereby increasing the area of the circuit by about five times, in the worst-case. Additionally, the amount of time for which the unit remains in idle state should be long enough so that the dynamic power consumed in forcing the circuit to a low-leakage state and the leakage power dissipated in the standby state together is less than the leakage power without the technique.

Another technique for leakage power control known in the art is referred to as power gating. Power gating turns off the devices by cutting off their supply voltage. This technique makes use of a bulky NMOS and/or PMOS device (sleep transistor) in the path between the supply voltage and ground. The sleep transistor is turned on when the circuit is active and turned off when the circuit is in an idle state with the help of a sleep signal, thereby creating virtual power and ground rails in the circuit. Hence, there is a significant detrimental effect on the switching speed when the circuit is active. The identification of the idle regions of the circuit and the generation of the sleep signal require additional hardware capable of predicting the circuit states accurately. This additional hardware consumes power throughout the circuit operation even when the circuit is in an idle state to continuously monitor the circuit state and control the sleep transistors.

The use of multiple threshold voltage CMOS (MTCMOS) technology for leakage control is also known in the art. With this method, the transistors of the gates are at a low threshold voltage and the ground is connected to the gate through a high threshold voltage NMOS gating transistor. The logical function of a gating transistor is similar to that of a sleep transistor. With this method, the existence of reverse conduction paths tends to reduce the noise margin or in the worst case may result in complete failure of the gate. Moreover, there is a performance penalty since high threshold transistors appear in series with all the switching current paths. A variation of the MTCMOS technique is the Dual $V_t$ technique, which uses transistors with two different threshold voltages. Low threshold transistors are used for the gates on the critical path and high threshold transistors are used for those not in the critical path. In both MTCMOS and Dual $V_t$ methods, additional mask layers for each value of threshold voltage are required for fabricating the transistors selectively according to their assigned threshold voltage values. The use of additional mask layers makes the fabrication process increasingly complex.

In addition to these limitations, the techniques discussed above suffer from "turning on latency", that is, when the idle subsections of the circuit are reactivated, they cannot be used immediately because some time is needed before the sub-circuit returns to its normal operating condition. The latency for power gating is typically a few cycles, and for Dual $V_t$ technology, can be much longer. Also, the techniques known in the art are not effective in controlling the leakage power when the circuit is in active state.

It is additionally known in the art to use the concept of forced stacks for leakage control. Forced stacking introduces an additional transistor for every input of the gate in both N- and P-networks. This ensures that two transistors are Off instead of one for every Off-input of the gate and hence, makes a significant savings on the leakage current. However, the loading requirements for each input introduced by the forced stacking, reduces the drive current of the gate significantly. This results in a detrimental impact on the speed of the circuit.

In one prior art method, a combination of sleep transistors and the stacking effects are used to reduce leakage power. This method identifies a circuit input vector for which the leakage current of the circuit is the lowest possible. The sleep signal controlled transistors are inserted away from the critical path where only one transistor is Off when low leakage input vector is applied to the circuit. Hence, this technique is input vector dependent. Moreover, as this technique uses sleep transistors, it requires additional hardware to control the sleep transistors. The additional hardware consumes power in both idle and active states of the circuit.

Accordingly, what is needed in the art is an efficient leakage power reduction method for deep submicron and nanometer circuits that is input vector independent, minimizes the additional hardware required, is effective in both idle and active states, has a minimal impact on switching speed of the circuit and does not add additional fabrication complexity to the circuit.

SUMMARY OF INVENTION

The longstanding but heretofore unfulfilled need for an improved leakage power reduction circuit and method for deep submicron and nanometer CMOS circuits is now met by a new, useful, and nonobvious invention.

This present invention relates to a method and apparatus for reducing the leakage power in CMOS circuits. In deep submicron and nanometer CMOS circuits, the reduction of the threshold voltage due to voltage scaling leads to an increase in sub threshold leakage current and hence, static power dissipation. The present invention provides a novel technique for designing CMOS gates, which significantly cuts down the leakage current without increasing the dynamic power dissipation.

In accordance with the present invention, two leakage control transistors, a p-type and a n-type, are introduced within the logic gate for which the gate terminal of each leakage control transistor (LCT) is controlled by the source of the other. In this arrangement, one of the LCT's is always "near its cut-off voltage" for any input combination. This increases the resistance of the path from $V_{dd}$ to ground leading to a significant decrease in leakage currents. The gate-level netlist of the given circuit is first converted into a static CMOS complex gate implementation and then LCTs are introduced to obtain a leakage controlled circuit. The significant feature of the present invention is that it works effectively in both active and idle states of the circuit resulting in better leakage reduction compared to other techniques. Further, the proposed technique overcomes the limitations posed by other currently existing methods for leakage reduction. Experimental results indicate an average leakage reduction of 79.4% for MCNC '91 benchmark circuits. An apparatus comprising:

In accordance with the present invention is provided a leakage reduction circuit to be coupled to an integrated logic circuit, the integrated logic circuit comprising a plurality of logic gates, the leakage reduction circuit comprising a p-type leakage control transistor and an n-type leakage control transistor arranged such that an input to the integrated logic circuit will place one of either the p-type leakage control transistor or the n-type leakage control transistor near it's associated cut-off voltage.

In a particular embodiment, an integrated logic circuit comprising a voltage output node, a pull-up circuit and a pull-down circuit is provided. A leakage reduction circuit including a p-type leakage control transistor and an n-type leakage control transistor is introduced between the supply voltage and ground of the logic circuit such that the gate terminal of the p-type leakage control transistor is coupled to the source of the n-type leakage control transistor and the gate terminal of the n-type leakage control transistor is coupled to the source of the p-type leakage control transistor, wherein the drain of the p-type leakage control transistor is coupled to the drain of the n-type leakage control transistor and to the voltage output node of the semiconductor integrated logic circuit, and wherein the source of the p-type leakage control transistor is coupled to the pull-up circuit of the integrated circuit and the source of the n-type leakage control transistor is coupled to the pull-down circuit of the integrated circuit.

The integrated logic circuit may be a complementary metal oxide semiconductor (CMOS) circuit further comprising at least one p-type transistor and at least one n-type transistor, such that the drain of the at least one p-type transistor is coupled to the pull-up circuit and the drain of the at least one n-type transistor is coupled to the pull-down circuit. The CMOS circuit may additionally comprise a plurality of p-type transistor and n-type transistors connected in series and/or in parallel as required by the logic of the circuit design.

In order to reduce the propagation delay of the integrated circuit, in a particular embodiment, the p-type leakage control transistor and the n-type leakage control transistor may be appropriately sized.

In a particular embodiment, the integrated circuit is a static complementary metal oxide semiconductor complex (SCCG) gate. While a SCCG may be comprised of many p-type an n-type transistors, in a preferred embodiment designed to reduce the propagation delay of the circuit, the SCCGF includes two p-type transistors and two n-type transistors, such that the introduction of the p-type leakage control transistor and the n-type leakage control transistor of the leakage reduction circuit results in at most six transistors between the supply voltage of the circuit and ground.

A leakage power reduction method for use with integrated circuits in accordance with the present invention, includes the steps of, identifying an integrated logic circuit, the integrated logic circuit comprising a plurality of logic gates, and inserting a leakage reduction circuit comprising a p-type leakage control transistor and an n-type leakage control transistor arranged such that an input to the integrated logic circuit will place one of either the p-type leakage control transistor or the n-type leakage control transistor near it's associated cut-off voltage.

In a particular embodiment, the leakage power reduction method o the present invention includes identifying a voltage output node, a pull-up circuit and a pull-down circuit of the integrated logic circuit and inserting a leakage reduction circuit comprising a p-type leakage control transistor and an n-type leakage control transistor, wherein the gate terminal of the p-type leakage control transistor is coupled to the source of the n-type leakage control transistor and the gate terminal of the n-type leakage control transistor is coupled to the source of the p-type leakage control transistor, wherein the drain of the p-type leakage control transistor is coupled to the drain of the n-type leakage control transistor and to the voltage output node of the semiconductor integrated logic circuit, and wherein the source of the p-type leakage control transistor is coupled to the pull-up circuit of the integrated circuit and the source of the n-type leakage control transistor is coupled to the pull-down circuit of the integrated circuit.

Any logic circuit can be expressed in terms of it's gate-level netlist and hence, the method of designing a leakage controlled circuit begins with a gate-level netlist. In accordance with the present invention, a method of obtaining a leakage controlled complementary metal oxide semiconductor circuit includes the steps of, identifying a gate-level netlist of a complementary metal oxide semiconductor logic circuit, inputting the netlist to a script to generate a textual description of the logic circuit, performing mapping of the textual description to generate a plurality of static complex complementary metal oxide semiconductor gates having a common pull-up node and a common pull-down node, introducing a leakage reduction circuit coupled between the pull-up node and the pull-down node of the static complex complementary metal oxide semiconductor, the leakage reduction circuit having one p-type transistor and one n-type transistor.

In accordance with a particular embodiment, the script used to generate the textual description of the logic circuit is a Berkeley Logic Interchange Format script. Mapping the textual description may be accomplished utilizing technology dependent mapping and a corresponding gate library, or technology independent mapping and a corresponding virtual library.

In an additional embodiment, the method step of introducing the leakage reduction circuit further includes inserting a leakage reduction circuit comprising a p-type leakage control transistor and an n-type leakage control transistor arranged such that an input to the integrated logic circuit will place one of either the p-type leakage control transistor or the n-type leakage control transistor near it's associated cut-off voltage.

As such, the method and apparatus for leakage control in CMOS circuits, in accordance with the present invention provides an efficient leakage power reduction method for deep submicron and nanometer circuits that is input vector independent, minimizes the additional hardware required, is effective in both idle and active states, has a minimal impact on switching speed of the circuit and does not add additional fabrication complexity to the circuitry.

Other aspects and advantages of the present invention can be seen upon review of the figures, the detailed description, and the claims, which follow.

BRIEF DESCRIPTION OF THE DRAWINGS

For a fuller understanding of the nature and objects of the invention, reference should be made to the following detailed description, taken in connection with the accompanying drawings, in which:

FIG. 2 is a listing of the equations in accordance with the present invention.

FIG. 4 is an illustration of an inverter gate, (a) without the leakage reduction circuit in accordance with the present invention, and (b) with the leakage reduction circuit in accordance with the present invention.

FIG. 6 is an illustration of the DC characteristics of 2-input NAND gate, wherein (a) illustrates the characteristics of basic NAND gate and (b) illustrates the characteristics of a NAND gate having leakage reduction circuitry in accordance with the present invention.

FIG. 7 is a table representing the state matrix of a 2-input LCT (leakage control transistor) NAND gate in accordance with the present invention.

FIG. 9 is a table representing the threshold voltages of MOS models in accordance with the present invention.

FIG. 10 is a table representing the leakage power for a 2-input NAND gate in accordance with the present invention.

FIG. 11 is a table representing the noise analysis of various gates in accordance with the present invention.

FIG. 12 is an illustration of the setup used for performing the noise analysis using HSPICE in accordance with the present invention.

FIG. 13 is a table representing the area overhead for an LCT gate in accordance with the present invention.

FIG. 14 is an illustration of two implementations of AND-OR-Inverter gate in accordance with the present invention.

FIG. 17 is a table representing the experimental results for MCNC'91 benchmarks in accordance with the present invention.

DETAILED DESCRIPTION OF THE INVENTION

Figure 1:
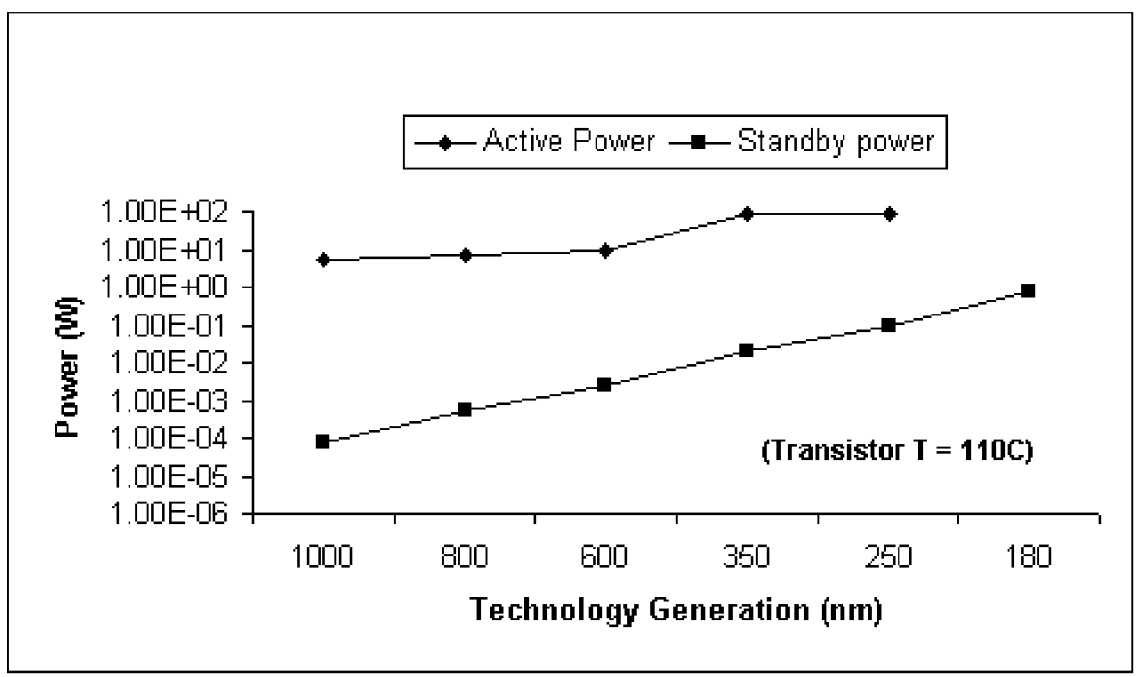
FIG. 1 is an illustration of a voltage supply and threshold voltage-scaling trend as known in the prior art.
Figure 3:
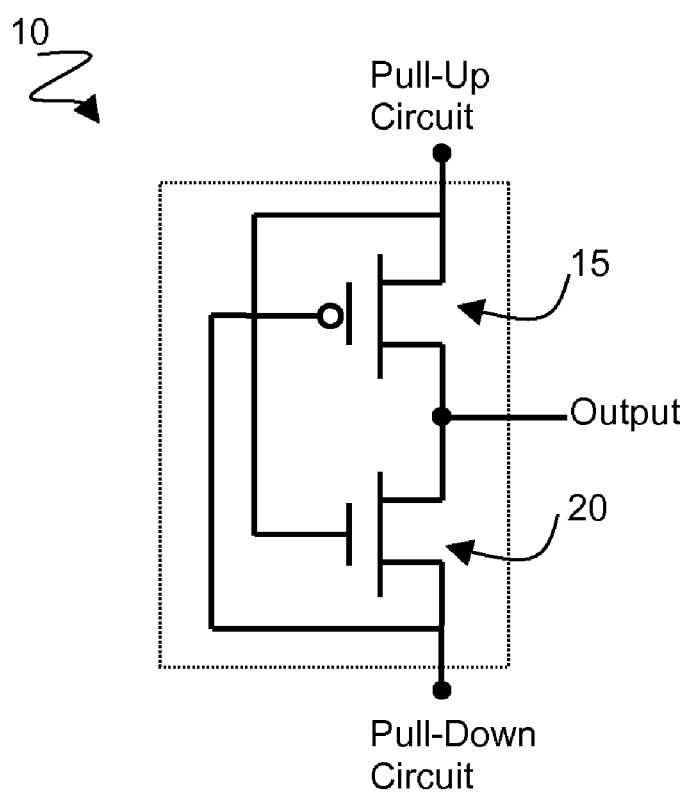
FIG. 3 is an illustration of the leakage reduction circuit in accordance with the present invention.

For short channel MOSFETs, the leakage current calculation is not straightforward due to the highly nonlinear behavior of the drain current of the device with respect to source/drain voltages. The present invention uses the Berkeley Short-Channel IGFET (BSIM) Predictive Technology Model to estimate the leakage power dissipation, as it fits well with HSPICE simulations. In the BSIM model, the threshold voltage ($V_t$) is expressed as in FIG. 2 (1), where $V_{FB}$ is the flat-band voltage, $\phi_s$ is twice the Fermi potential, $k_1$ and $k_2$ represent the non-uniform doping effect and $\eta$ models the drain induced barrier lowering (DIBL) effect, an undesirable punch through/current flowing between the source and drain below the surface of the channel. The leakage current for NMOS transistors operating in weak-inversion region (i.e.=0) is given by FIG. 2 (2), where $V_T$ is the thermal voltage and is given by q/kT, n is the sub-threshold slope coefficient, and $I_0$ is given by equation (3) of FIG. 3. As such, FIG. 2 (2) gives a simple method for estimating the leakage current in a single NMOS transistor. A similar expression for the leakage current in a single PMOS transistor can be obtained.

In most CMOS logic design styles, the gates consist of series-parallel networks of PMOS and NMOS transistors. The leakage current contributed by the MOS transistors connected in parallel is the sum of the currents through the individual transistors. However, in the case of transistors connected in series, the evaluation of leakage current becomes complex due to its non-linear characteristics. The analysis of the current through a stack of transistors when they operate in sub-threshold region, is as given in FIG. 2 (4) where, $I_{si}$ (I=1,2,3) is the leakage current for i stacked MOS transistors and $I_{s1}$ is given by equation (2) of FIG. 2. The equation of FIG. 2 (4) shows that the leakage current of the MOS network can be expressed as a function of a single MOS transistor. If the number of stacked MOS transistors is more than three, the leakage current is very small and can be neglected.

According to the present invention, the method and apparatus for the reduction of leakage power is the effective combination of transistors in the path from supply voltage to ground. This is based on the observation that "a state with more than one transistor Off in a path from supply voltage to ground is far less leaky than a state with only one transistor Off in any supply to ground path". In the method of the present invention, two Leakage Control Transistors (LCTs) in each CMOS gate as introduced such that one of the LCT's is near its cut-off region of operation. As shown with reference to FIG. 3, in accordance with the present invention, the leakage reduction circuit 10 in accordance with the present invention includes a p-type transistor 15 and an n-type transistor 20 coupled such that one of them is near its cut-off region of operation regardless of the input to the circuit.

With reference to FIG. 4, an exemplary embodiment illustrates the incorporation of the leakage reduction circuit in accordance with the present invention into a CMOS inverter. FIG. 4(a) illustrates a typical CMOS inverter without the leakage reduction circuitry. FIG. 4(b) illustrates the leakage reduction circuitry wherein a p-type leakage control transistor 15 and an n-type leakage control transistor 20 are coupled such that the gate terminal of the p-type leakage control transistor 35 is coupled to the source of the n-type leakage control transistor 40 and the gate terminal of the n-type leakage control transistor 25 is coupled to the source of the p-type leakage control transistor 30, and wherein the drain of the p-type leakage control transistor 45 is coupled to the drain of the n-type leakage control transistor 50 and to the voltage output node 55 of the semiconductor integrated logic circuit, and wherein the source of the p-type leakage control transistor 30 is coupled to the pull-up circuit 60 of the integrated circuit and the source of the n-type leakage control transistor 40 is coupled to the pull-down circuit of the integrated circuit 65.

Figure 5:
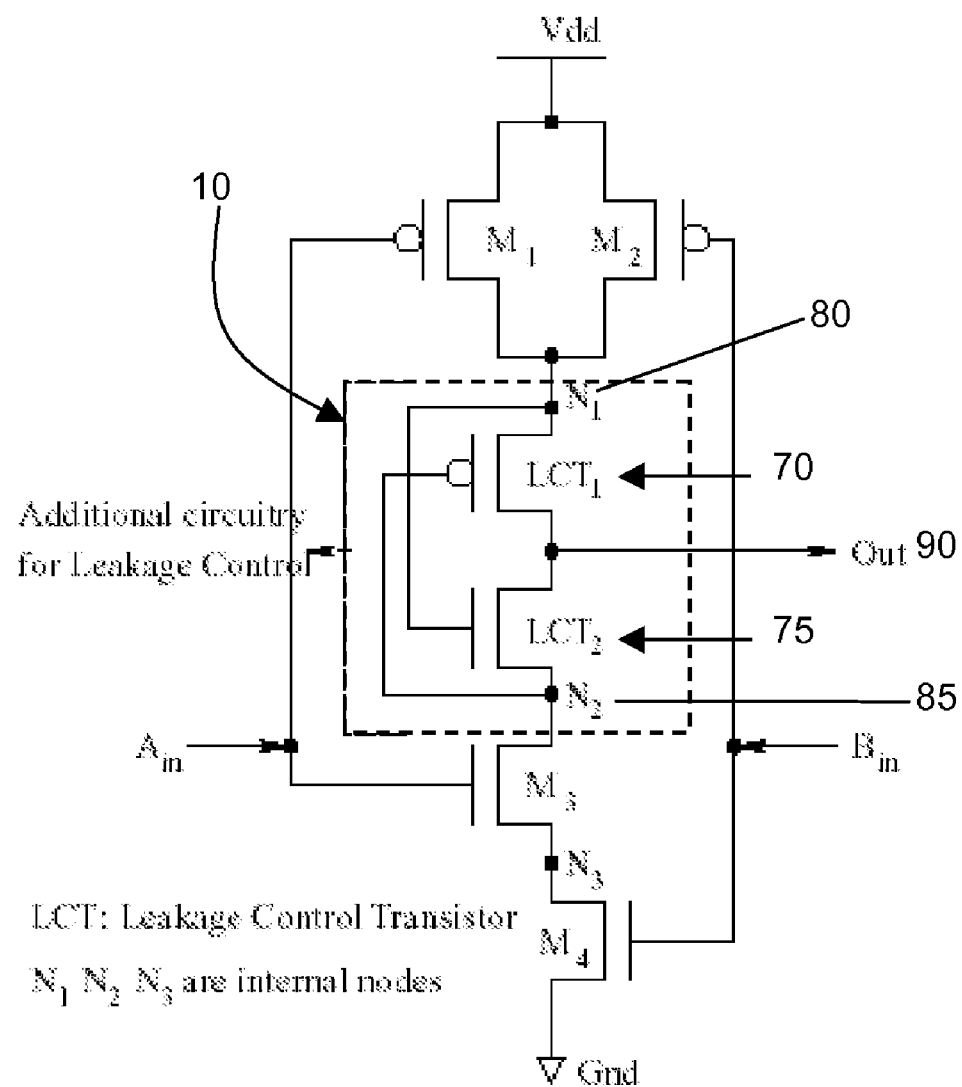
FIG. 5 is an illustration of a two input NAND gate incorporating the leakage reduction circuit in accordance with the present invention.

In an additional exemplary embodiment of the present invention, the LEakage Control TransistOR technique (LECTOR) in accordance with the present invention is illustrated with the case of a NAND gate. A CMOS NAND gate with the addition of two leakage control transistors is shown in FIG. 5. Later referred to as an LCT NAND gate.

Two leakage control transistors $LCT_1$ (PMOS) 70 and $LCT_2$ (NMOS) 75 are introduced between the nodes $N_1$ 80 and $N_2$ 85 of the pull-up and pull-down logic of the NAND gate. The drain nodes of the transistors $LCT_1$ and $LCT_2$ are connected together to form the output node 90 of the NAND gate. The source nodes of the transistors are connected to nodes $N_1$ and $N_2$ of pull-up and pull-down logic respectively. The switching of transistors $LCT_1$ and $LCT_2$ are controlled by the voltage potentials at nodes $N_2$ and $N_1$ respectively. This wiring configuration ensures that one of the LCT's is always near its cut-off region, irrespective of the input vector applied to the NAND gate. This can be seen from the DC characteristics shown in FIG. 6, obtained from HSPICE simulations. FIG. 6(a) shows the DC characteristics of the unmodified NAND gate and FIG. 6(b) shows that of the LCT NAND Gate, when the input $A_{in}$ is fixed at 1V and $B_{in}$ is varied from 0V to 1V.

Consider the DC characteristics of LCT NAND gate. When $A_{in}$=1V and $B_{in}$=0V, the voltage at the node $N_2$ is 800 mV. This voltage is not sufficient to turn $LCT_1$ completely to off state. Hence, the resistance of $LCT_1$ will be lesser than its off resistance, allowing conduction. Even though the resistance of $LCT_1$ is not as high as its off state resistance, it increases the resistance of $V_{dd}$ to ground path, controlling the flow of leakage currents, resulting in leakage power reduction. Similarly when $A_{in}$=1V and $B_{in}$=1V, the voltage of node is 200 mV, operating the transistor near its cut-off region. The state of the transistors for all possible combinations of input vectors for LCT NAND gate are tabulated in as shown in the table of FIG. 7. Thus the introduction of LCT's increases the resistance of the path from $V_{dd}$ to ground. This also increases the propagation delay of the gate. To reduce this hostile effect, the transistors of the LCT gate are sized such that the propagation delay is equal to its conventional counter part.

Figure 8:
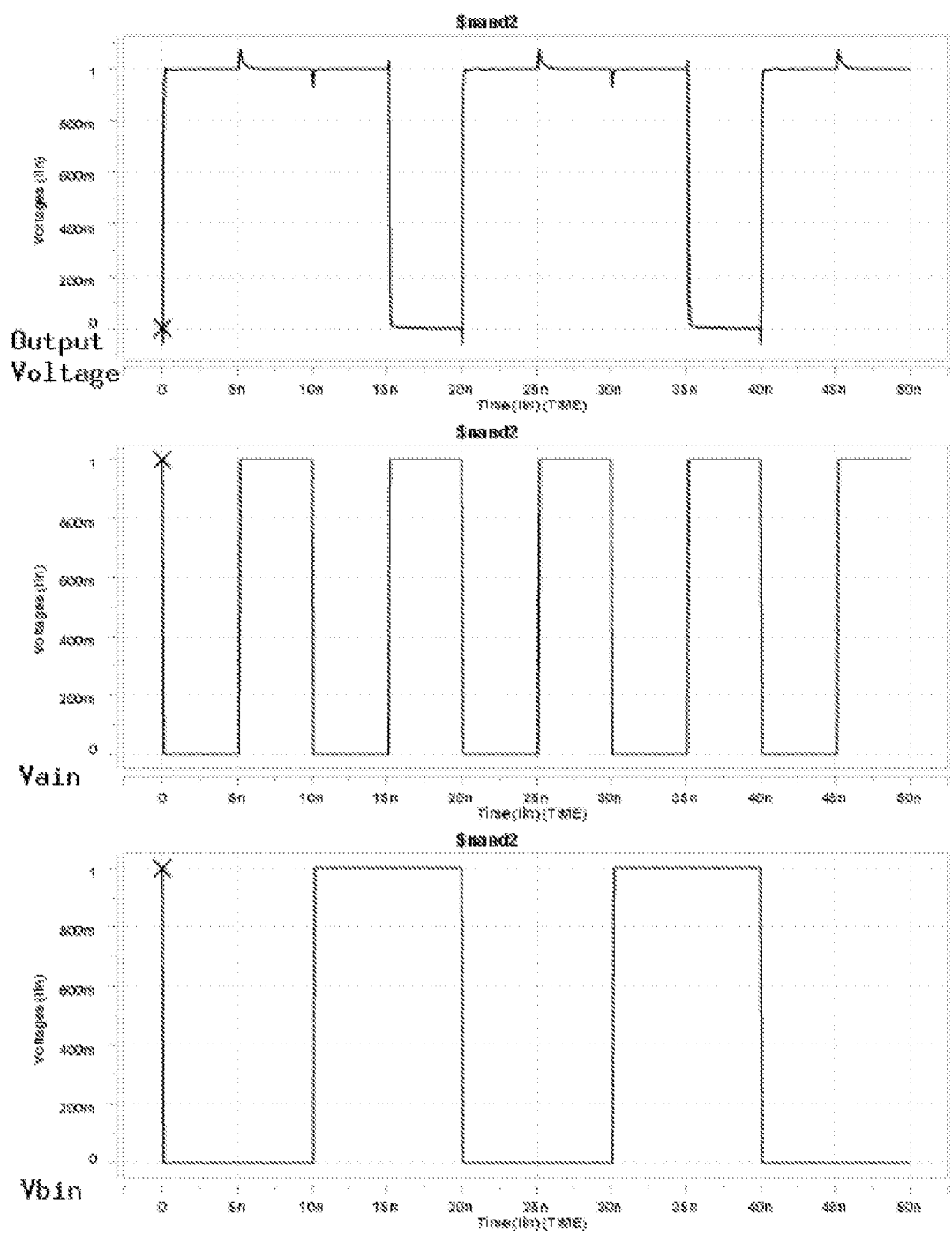
FIG. 8 illustrates the transient characteristics of a 2-input LCT NAND gate using HSPICE in accordance with the present invention. The x-axis shows simulation time in nanoseconds and y-axis shows the voltage levels in mVs.

FIG. 8 shows the transient curves obtained by HSPICE at various nodes of LCT NAND gate simulated for 70 nm technology at 1V supply voltage. It can be observed from the curves that LCT NAND produces exact output logic levels. The threshold voltages used by BSIM predictive models of 180 nm, 130 nm, and 100 nm technologies at 1V supply voltage are tabulated as shown in the table of FIG. 9.

The transistors of the LCT NAND gate are sized to study its effect on the propagation delay of the gate. Y-LCT gates are obtained by sizing the widths of only the leakage control transistors, $LCT_1$ and $LCT_2$ to Y-times the width of other PMOS and NMOS transistors of the gate respectively. Also, adjustments of the widths of all the transistors of the LCT NAND gate have been made such that its propagation delay is almost equal to that of a conventional NAND gate (This gate is referred to as $I_{so}$-LCT NAND gate). The widths of PMOS and NMOS transistors, except LCT transistors, used in simulation of Y-LCT gates are set to two and three times the minimum feature width of the respective process variation.

The leakage power dissipation and propagation delay values for 2-input NAND gate using 100 nm and 70 nm technology processes are tabulated as shown in the table of FIG. 10. It can be observed from the tables of FIG. 9 and FIG. 10, that as the threshold voltage decreases, which is the case as we move towards deep submicron, the technique of the present invention produces better leakage power reductions. Hence, the use of the leakage reduction method in accordance with the present invention enhances further reduction of the supply voltage along with the threshold voltage, thereby favoring technology advancements.

As previously discussed, in a prior art technique the sleep transistors have to be able to isolate the power supply and/or ground from the rest of the transistors of the gate. Hence, they need to be made bulkier, dissipating more dynamic power. This offsets the savings yielded when the circuit is idle. Moreover, use of sleep transistors is input vector dependent and requires additional circuitry to monitor and control the switching of the sleep transistors. Thus, it consumes power in both active and idle states. In comparison, the leakage reduction method in accordance with the present invention is vector independent and the required control signals are generated within the gate. Forced stacks, as known in the prior art, have 100% area overhead. In comparison, the method of the present invention requires exactly two additional transistors for every path from supply voltage to ground irrespective of the logic function realized by the gate. The loading requirements of the gate with forced stacks are huge and depend on the number of additional transistors added. In comparison, the loading requirements with LCTs are much lower and are a constant. Hence, the performance degradation is insignificant in the case of the present invention, and the major drawback faced by forced stack technique is overcome.

The table of FIG. 11 illustrates the effect of noise on various LCT gates and its corresponding conventional gates. Noise analysis is performed by creating a spice deck of the circuits and the experiment setup is shown in FIG. 12 and simulating it using HSPICE. The experimental data is based on 70 nm process parameters and 25° C. temperature. A switching waveform is applied at node A to generate a noise waveform on net N. The waveform on net N is denoted as $X(t)$, response on the fanout of net N as $Y(t)$ and the transient sensitivity as $S(t)$ (FIG. 12(a)). If the waveform of the net N is slightly changed by a constant voltage D, i.e. $X_1(t)=X(t)+D$, then the response of the fanout of net N is $Y_1(t)$ (FIG. 12(b)). The transient sensitivity $S(t)$ is defined as the ratio of the change in the output voltage to the change in the input voltage when the input is changed by a very small DC offset, given by equation 5 of FIG. 2.

The sensitivity reported in the table of FIG. 11 is the maximum value of the transient sensitivity. The sensitivity gives a measure of how the fanout of net N reacts to the noise waveform on net N and indicates whether the noise is amplified or attenuated. If sensitivity of a net is greater than one then the net is said to have a noise failure. It can be seen from the table of FIG. 11 that the LCT gates show stability to noise injections and the noise sensitivity values are very close to that of conventional gates. This is important to show that the technique in accordance with the present invention is stable to noise fluctuations.

A method to control the leakage power in a 2-input NAND gate was described above. Extension of this idea to all the basic logic gates results in the area overhead of the entire circuit increasing up to an upper bound of 60%, depending on the logic gates used. The area overhead on various logic gates implemented using LCTs is tabulated in the table of FIG. 13. In an additional embodiment of the present invention is presented a generalized approach, which reduces the area overhead of the overall circuit along with significant leakage reduction.

Consider a 4-input AND-OR-Inverter (AOI22) gate. FIG. 14 shows two different implementations of the gate. The first implementation (a) uses two 2-input AND gates, one 2-input OR gate and an Inverter, requiring a total of 20 transistors for its realization. A second implementation (b) shows an equivalent compound/complex gate realization. It is known in the art that a compound gate is formed by the combination of series- and parallel-MOS structures with complementary pull-up and pull-down logic. The required series and parallel combinations of transistors are generated by analyzing the relevant Karnaugh map for both n- and p-logic structures and using De-Morgan's theorems. As these gates are built on static CMOS technology, they are called Static CMOS Complex Gates (SCCG). SCCG implementation of AOI22 gate needs 8 transistors and hence is an efficient method for its realization.

In a preferred embodiment of the present invention, SCCG gates are used for the leakage reduction method as it not only saves area but also suits well for inserting leakage control transistors. This is because SCCG gates have exactly one common node, which connects the pull-up and pull-down circuits of the gate. Hence, in this gate, all the paths from the supply voltage to ground would pass through this node. Inserting LCTs at this node would control the leakage currents flowing through all the paths in the gate thereby saving significantly.

Figure 15:
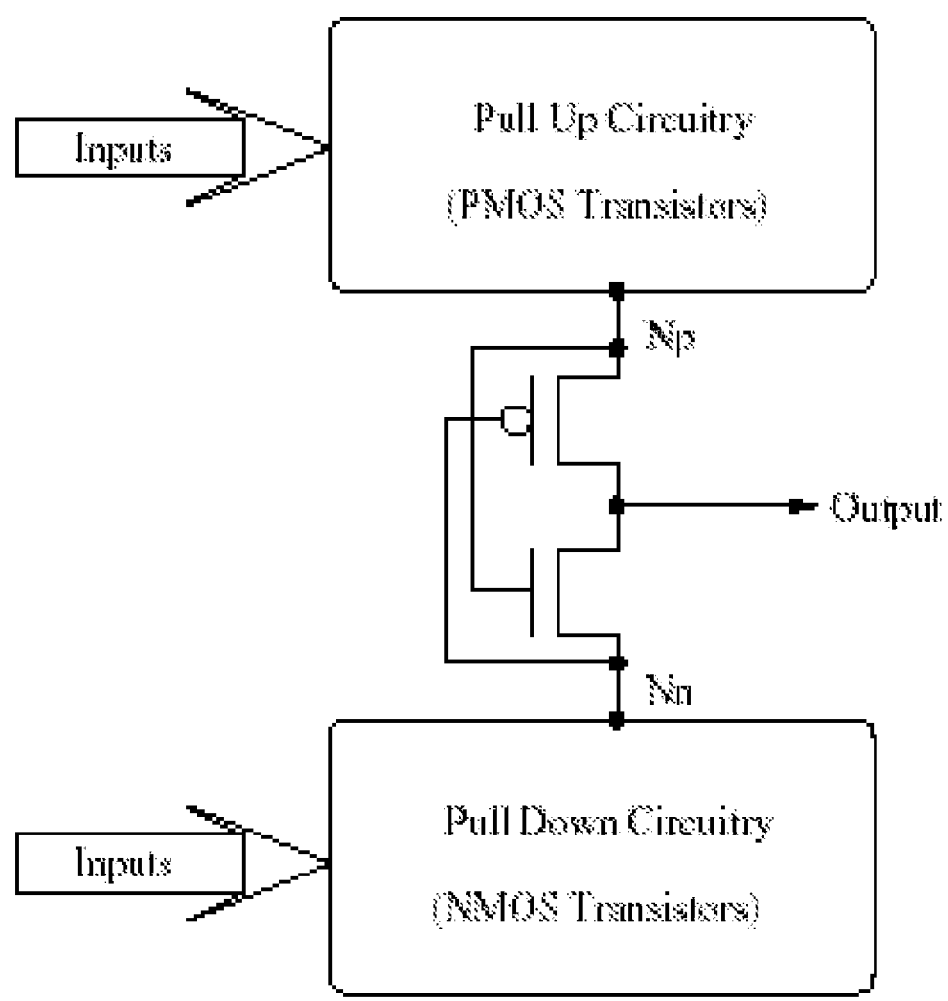
FIG. 15 is an illustration of a generalized structure for leakage controlled gates in accordance with the present invention.

The limitation with SCCG gates is that if the number of transistors in series exceeds an upper limit in any path of pull-up or pull-down logic then there is a hostile effect on the propagation delay of the gate. Typically this upper bound can be safely fixed to three or even four transistors. The leakage power in the AOI22 gate can be controlled by adding the two LCTs between the pull-up and pull-down logic of the implementation shown in the FIG. 15. FIG. 15 shows the general scheme for converting any SCCG gate to leakage-controlled gate.

Figure 16:
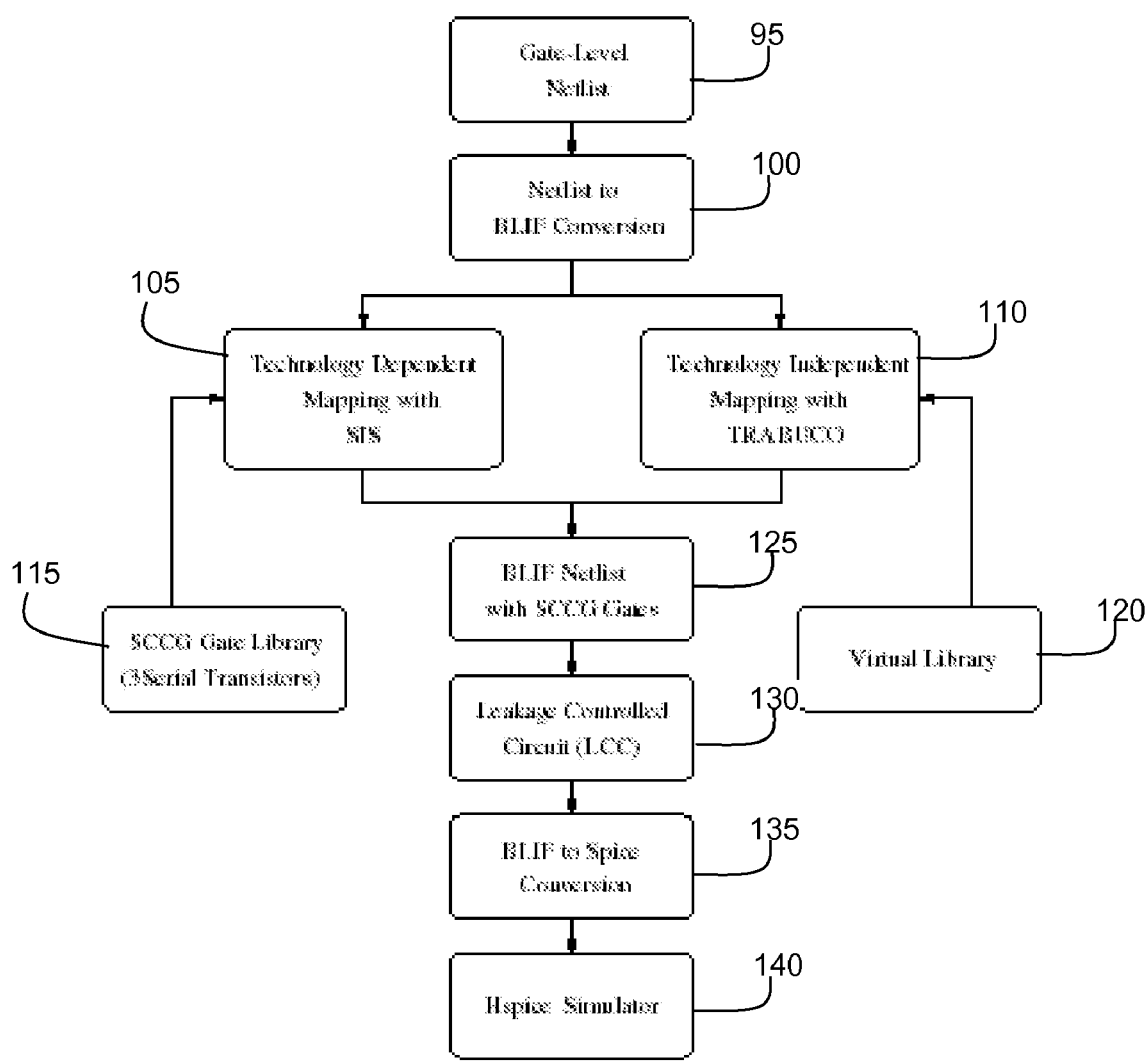
FIG. 16 is an illustration of the general design flow for the method in accordance with the present invention.

Any CMOS logic circuit can be expressed in terms of its gate-level netlist and hence, is the starting point of the design methodology in accordance with the present invention. FIG. 16 describes the sequence of steps for obtaining a leakage-controlled circuit from the gate-level netlist. The gate-level netlist 95 is fed as input to a script, which generates the corresponding Berkeley Library Interchange Format (BLIF) 100. The Sequential and Combinational circuit Synthesis System (SIS tool) 105, known in the art, or the TRAnsistor Binding Using COmplex gates (TRABUCO) 110 tool, known in the art, can be used for performing technology mapping of the BLIF netlist. Technology mapping comprises of covering phase and matching phase. SIS is a technology dependent mapping tool and hence uses a standard set of gates pre-defined in its library 115 for performing technology mapping.

A library of SCCG gates with a maximum of two series transistors each was created. The constraint on the maximum number was induced in the topology for performance reasons. The covering phase in the SIS tool is performed by representing the netlist in the form of tree called parent tree. The matching is done by dividing the parent tree into sub-trees. Each sub-tree is then replaced with the logic gate in the library whose tree representation matches efficiently.

TRABUCO, on other hand, is a technology independent mapping tool, which maps the netlist on to a virtual library 120 of SCCG gates. The tool creates virtual library of SCCG gates dynamically and hence does not need any library support. The set of SCCG gates used by the tool depends on the number of serial transistors input by the user. The covering scheme used by this tool is based on the dynamic tree covering approach similar to 0-1-knapsack problem. This approach generates a minimal number of multi-input SCCGs. The circuit with SCCG gates obtained by SIS or TRABUCO tool from the input netlist 125 is then converted to LECTOR-style circuit 130 by introducing LCTs as shown in FIG. 15. The circuit is then converted to spice format 135 with the help of a script for simulation with HSPICE simulator 140.

In an exemplary embodiment of the present invention, the leakage reduction method in accordance with the present invention was implemented and tested on MCNC '91 benchmark circuits. First, the MCNC '91 benchmark netlists were converted to BLIF using a script. SIS tool takes the BLIF input and performs technology mapping to SCCG gates. SIS tool provides various scripts, which aid in mapping the BLIF to the needs of the user. Read BLIF script was used for reading the BLIF netlist by the SIS tool. Read library script was invoked to read library of gates from a file in genlib format. SIS tool performs the covering phase of technology mapping by tree-covering algorithm and the logical decomposition of gates using the tech decomp script. The matching phase of the technology mapping was completed with the map script optimized for area.

The number of transistors in the path from $V_{dd}$ to ground influences the operation of LCT gates. As the number of transistors in the path increases, the body effect becomes prominent, resulting in incorrect logic switching. So the number of transistors on any path from $V_{dd}$ to ground of LCT gates is restricted to six (3 PMOS and 3 NMOS including the LCT's). Hence, SCCG library with gates constrained to two series transistors was used for generating LECTOR-style circuits. The 8 different SCCG gates which can be realized with two series transistors are inverter, buffer, 2-input NAND and NOR gates, 2-input AOI and OAI gates (AOI22, AOI21, OAI22, OAI21). After mapping the BLIF to the SCCG library, these gates are replaced with the leakage controlled gates, designed by the adding two LCTs to SCCG gates, to obtain a LCT MCNC Circuit. The addition of LCT's would make the number of series transistors in LCT gates to three.

In order to make a fair comparison with the circuit implemented without the leakage reduction method of the present invention, a library of gates was created containing at most 3 series transistors. This library contains inverter, buffer, 2 and 3 input NAND, NOR, OR, AND gates, and 2-input XOR gate. SIS tool is used to map the BLIF netlist on to this library to obtain an Unmodified MCNC circuit (referred to as U-MC circuit later). The critical path delays of both LCT MCNC (referred to as LCT-MC) circuit and the corresponding U-MC circuit are analyzed using HSPICE. The transistors of LCT gates present on the critical path of the LCT-MC circuit are sized such that the critical path delay is kept almost equal to that of the U-MC circuit. This helps to make a fair and direct comparison of circuits including the leakage reduction circuitry in accordance with the present invention and U-MC circuits with respect to power dissipation. The HSPICE simulator was preferred for measuring the leakage power due to its accuracy. Simulations were performed assuming 70 nm fabrication process parameters generated using the BSIM predictive models with temperature set to 25° Celsius.

Leakage power dissipation was measured by exciting both circuits with the same set of randomly generated input vectors. After applying one input vector, the circuit is made to wait long enough before exciting it with the next input vector. This would allow the circuit's switching activity to die down after which, the power dissipated is due to leakage currents. The power was measured during this time period and averaged over all the input vectors to obtain the average leakage power dissipations for each circuit. The average total power dissipated was measured in each case. To measure the dynamic power dissipation, both the circuits are driven with same excitation such that the switching activity is very high. The input vectors are fed at a faster rate not allowing the circuit to settle down. Hence, in this case, leakage power dissipation will be minimal.

The experimental results are listed in the table of FIG. 17. The first column lists the MCNC '91 benchmark circuits. The average leakage power dissipation (in μW) for U-MC and LCT-MC circuits are given in columns two and three respectively. Columns six and seven provide the average total power dissipation (in μW) for the respective circuits. Both the leakage and total power estimates were obtained by averaging the circuit simulations over 10 different sets of 500 randomly generated (with a probability of 0.5) input patterns. The input patterns were triggered with long time intervals between them so as to have minimum circuit switching activity. Thus, it was ensured that the major contributor to the power dissipation is leakage power.

The dynamic power estimates (in μW) obtained for U-MC and LCT-MC circuits are indicated in columns four and five respectively. Ten different sets of 1000 randomly (with a probability of 0.5) generated input patterns are used to estimate dynamic power in both cases. The inputs were applied in quick succession so as to maintain high switching activity in the circuit. Hence the major contributor to the power dissipation in this case is dynamic power. The normalized area of LCT-MC circuits with respect to its corresponding U-MC circuits is given in column eight. Standard cell layouts were created of all the gates used in synthesis of both LCT-MC and U-MC circuits. Cadence Silicon Ensemble was used for placement and routing of the netlists using the standard cell layouts. The layout area required by the circuits were measured to calculate the area overheads of the LCT-MC circuits with respect to U-MC circuits.

The critical path delays of U-MC and LCT-MC circuits are made equal by sizing LCT gates on critical path. The leakage power reduction results indicated for prior art techniques discussed have high delay and area penalties whereas those indicated for the method of the present invention are with zero delay penalty and much lesser area penalty. Normalized area is the ratio of layout areas of LCT-MC and U-MC circuits.

The results show an average reduction of 79.4% in average leakage power dissipation with an average area overhead of 14%. It should be noted that the leakage savings obtained is without any significant sacrifice in dynamic power and with zero delay penalty. Columns nine and ten of the table of FIG. 17 compares the leakage savings obtained for MCNC '91 benchmarks using the method in accordance with the present invention and the prior art techniques, wherein the prior art reference [101] is in reference to M.C. Johnson, D. Somasekhar, L.Y. Chiou, and K. Roy, "Leakage Control and Efficient Use of Transistor Stacks in Single Threshold CMOS," *IEEE Trans. On VLSI Systems*, vol. 10, no. 1, pp. 1-5, February 2002 and prior art reference [13] is in reference to V. Sundararajan, and K.K. Parhi, "Low Power Synthesis of Dual Threshold Voltage CMOS VLSI Circuits," in *Proc. Of ISLPED*, 1999, pp. 139-144. The technique based on transistor stacks has been chosen as a comparison. The dual threshold voltage technique combined with delay balancing and retiming, proposed in the prior art, is chosen for comparison because of its significant results in dual threshold voltage technique category. For circuits C432 to C7552, the results are compared with the dual threshold voltage technique known in the art and for circuits 11 to 110, the transistor stacks as known in the art are compared. It should be noted that leakage reduction results shown in the prior art suffer from delay and area penalties. The leakage control transistors in transistor stacks technique are sized to 30% of total sizing required to achieve zero delay penalty and hence results in average delay overhead of 16%. The area overhead due to additional transistors and control circuitry is about 46.3% to 50%. Also, the savings indicated for transistor stacks technique are obtained on application of the "Low Leakage Input Vectors" and neglect the dynamic power dissipations due to control circuitry. In general, the dynamic power dissipation due to control circuitry is very significant and may over shadow the savings in leakage power depending on the switching activity of control logic. In the case of Dual $V_T$ technique, the leakage savings given are with respect to benchmark circuits without performing technology mapping. When the technology mapping is performed before calculating the leakage reduction, the leakage savings will be significantly lesser for these circuits than that shown in the table of FIG. 17. Also, the results given are based on the maximum allowable delays for the gates with the threshold voltage scaled to as high as $0.5V_{dd}$. This would result in delay penalty of anywhere between 5% to 64% as pointed out in the prior art. In spite of these dissimilarities in calculations of leakage power savings, it can be observed from the table of FIG. 17 that the leakage reduction method in accordance with the present invention provides significantly better results.

The scaling down of device dimensions, supply voltage, and threshold voltage for achieving high performance and low dynamic power dissipation has largely contributed to the increase in leakage power dissipation. With deep sub-micron and nanometer technologies, the leakage current becomes more critical in portable systems where battery life is of prime concern. An efficient design methodology in accordance with the present invention is described for reducing the leakage power in CMOS circuits. The method in accordance with the present invention yields better leakage reduction as the threshold voltage decreases and hence aids in further reduction of supply voltage and minimization of transistor sizes. Unlike other leakage control techniques, the present invention does not need any control circuitry to monitor the states of the circuit. Hence, the preset invention avoids the sacrifice of obtained leakage power reduction in the form of dynamic power consumed by the additional circuitry to control the overall circuit states. Experimental results show that our technique yields average leakage reduction of about 79.4% for the same critical path delay in comparison to the unmodified circuit for MCNC '91 benchmarks with an area overhead of 14%.

It will be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. An apparatus comprising:
a leakage reduction circuit to be coupled to an integrated logic circuit, the integrated logic circuit comprising a plurality of logic gates, the leakage reduction circuit comprising a p-type leakage control transistor and an n-type leakage control transistor arranged such that an input to the integrated logic circuit will place one of either the p-type leakage control transistor or the n-type leakage control transistor near it's associated cut-off voltage.

2. The apparatus of claim 1, further comprising:
a semiconductor integrated logic circuit comprising a voltage output node, a pull-up circuit and a pull-down circuit; and
a leakage reduction circuit comprising a p-type leakage control transistor and an n-type leakage control transistor, wherein the gate terminal of the p-type leakage control transistor is coupled to the source of the n-type leakage control transistor and the gate terminal of the n-type leakage control transistor is coupled to the source of the p-type leakage control transistor, wherein the drain of the p-type leakage control transistor is coupled to the drain of the n-type leakage control transistor and to the voltage output node of the semiconductor integrated logic circuit, and wherein the source of the p-type leakage control transistor is coupled to the pull-up circuit of the integrated circuit and the source of the n-type leakage control transistor is coupled to the pull-down circuit of the integrated circuit.

3. The apparatus of claim 2, wherein the semiconductor integrated logic circuit is a complementary metal oxide semiconductor circuit further comprising at least one p-type transistor and at least one n-type transistor.

4. The apparatus of claim 3, wherein the drain of the at least one p-type transistor is coupled to the pull-up circuit and the drain of the at least one n-type transistor is coupled to the pull-down circuit.

5. The apparatus of claim 3, wherein the at least one p-type transistor further comprises a plurality of p-type transistors.

6. The apparatus of claim 3, wherein the at least one n-type transistor further comprises a plurality of n-type transistors.

7. The apparatus of claim 2, wherein the pull-up circuit further comprises a plurality of p-type transistors and the pull-down circuit further comprises a plurality of n-type transistors.

8. The apparatus of claim 2, wherein the p-type leakage control transistor and the n-type leakage control transistor are sized to reduce the propagation delay of the integrated circuit.

9. The apparatus of claim 1, wherein the integrated circuit is a static complementary metal oxide semiconductor complex gate.

10. The apparatus of claim 9, wherein the static complementary metal oxide semiconductor complex gate further comprises two p-type transistors and two n-type transistors.

11. A leakage power reduction method for use with integrated circuits, the method comprising the steps of:
identifying an integrated logic circuit, the integrated logic circuit comprising a plurality of logic gates;
inserting a leakage reduction circuit comprising a p-type leakage control transistor and an n-type leakage control transistor arranged such that an input to the integrated logic circuit will place one of either the p-type leakage control transistor or the n-type leakage control transistor near it's associated cut-off voltage.

12. The method of claim 11, further comprising the steps of:
identifying a voltage output node, a pull-up circuit and a pull-down circuit of the integrated logic circuit; and
inserting a leakage reduction circuit comprising a p-type leakage control transistor and an n-type leakage control transistor, wherein the gate terminal of the p-type leakage control transistor is coupled to the source of the n-type leakage control transistor and the gate terminal of the n-type leakage control transistor is coupled to the source of the p-type leakage control transistor, wherein the drain of the p-type leakage control transistor is coupled to the drain of the n-type leakage control transistor and to the voltage output node of the semiconductor integrated logic circuit, and wherein the source of the p-type leakage control transistor is coupled to the pull-up circuit of the integrated circuit and the source of the n-type leakage control transistor is coupled to the pull-down circuit of the integrated circuit.

13. The method of claim 11, wherein the semiconductor integrated logic circuit is a complementary metal oxide semiconductor circuit further comprising at least one p-type transistor and at least one n-type transistor.

14. The method of claim 13, wherein the drain of the at least one p-type transistor is coupled to the pull-up circuit and the drain of the at least one n-type transistor is coupled to the pull-down circuit.

15. The method of claim 13, wherein the at least one p-type transistor further comprises a plurality of p-type transistors.

16. The method of claim 13, wherein the at least one n-type transistor further comprises a plurality of n-type transistors.

17. The method of claim 12, wherein the pull-up circuit further comprises a plurality of p-type transistors and the pull-down circuit further comprises a plurality of n-type transistors.

18. The method of claim 12, further comprising the step of sizing the p-type leakage control transistor and the n-type leakage control transistor to reduce the propagation delay of the integrated circuit.

19. The method of claim 11, wherein the integrated circuit is a static complementary metal oxide semiconductor complex gate.

20. The method of claim 19, wherein the static complementary metal oxide semiconductor complex gate further comprises two p-type transistors and two n-type transistors.

21. A method of obtaining a leakage controlled complementary metal oxide semiconductor circuit, comprising the steps of:
identifying a gate-level netlist of a complementary metal oxide semiconductor logic circuit;
inputting the netlist to a script to generate a textual description of the logic circuit;
performing mapping of the textual description to generate a plurality of static complex complementary metal oxide semiconductor gates having a common pull-up node and a common pull-down node;
introducing a leakage reduction circuit coupled between the pull-up node and the pull-down node of the static complex complementary metal oxide semiconductor, the leakage reduction circuit having one p-type transistor and one n-type transistor.

22. The method of claim 21, wherein the script used to generate the textual description of the logic circuit is a Berkeley Logic Interchange Format script.

23. The method of claim 21, wherein the step of performing mapping of the textual description utilizes technology dependent mapping and a corresponding gate library.

24. The method of claim 21, wherein the step of performing mapping of the textual description utilizes technology independent mapping and a corresponding virtual library.

25. The method of claim 21, wherein the step of introducing the leakage reduction circuit further comprises inserting a leakage reduction circuit comprising a p-type leakage control transistor and an n-type leakage control transistor arranged such that an input to the integrated logic circuit will place one of either the p-type leakage control transistor or the n-type leakage control transistor near it's associated cut-off voltage.

* * * * *